(12) United States Patent
Jensen

(10) Patent No.: US 7,638,419 B2
(45) Date of Patent: Dec. 29, 2009

(54) METHOD OF FABRICATING A VIA ATTACHED TO A BOND PAD UTILIZING A TAPERED INTERCONNECT

(75) Inventor: Erik W. Jensen, Fredensborg (DK)

(73) Assignee: Intel Corporation, Santa Clara, CA (US)

( * ) Notice: Subject to any disclaimer, the term of this patent is extended or adjusted under 35 U.S.C. 154(b) by 117 days.

(21) Appl. No.: 11/948,748

(22) Filed: Nov. 30, 2007

(65) Prior Publication Data

US 2008/0090406 A1 Apr. 17, 2008

Related U.S. Application Data

(62) Division of application No. 11/382,450, filed on May 9, 2006, now Pat. No. 7,375,432, which is a division of application No. 09/740,103, filed on Dec. 18, 2000, now Pat. No. 7,088,002.

(51) Int. Cl.
 *H01L 21/44* (2006.01)
 *H05K 3/00* (2006.01)
 *H01L 23/48* (2006.01)
 *H05K 1/11* (2006.01)
 *H05K 7/10* (2006.01)

(52) U.S. Cl. ............ 438/612; 438/622; 29/874; 29/884; 257/773; 257/775; 257/E23.01; 257/E23.012; 257/E23.037; 257/E23.04; 257/E23.145; 174/261; 361/767

(58) Field of Classification Search ............ None
See application file for complete search history.

(56) References Cited

U.S. PATENT DOCUMENTS 3,601,750 A 8/1971 Mancini (Continued)

FOREIGN PATENT DOCUMENTS

DE 19642929 7/1997

(Continued)

OTHER PUBLICATIONS

"Advisory Action mailed Dec. 3, 2002 in U.S. Appl. No. 09/740,103", 3 pgs.

(Continued)

*Primary Examiner*—Alonzo Chambliss
(74) *Attorney, Agent, or Firm*—Schwegman, Lundberg & Woessner, P.A.

(57) ABSTRACT

Various embodiments include a method of forming an interconnect comprising forming at least two vias in a substrate, forming a conductive pad on a surface of the substrate, forming at least one tapered conductive segment on the surface of the substrate coupled to the conductive pad, wherein only a first via of the at least two vias is formed substantially beneath the conductive pad and is coupled to the conductive pad, a second via of the at least two vias is coupled to the conductive pad by a first one of the at least one tapered conductive segments, the first one of the tapered conductive segments having a first end having a first width and a second end having a second width, the first end being connected to the second via and the second end being connected to the conductive pad, the first width being less than the second width.

16 Claims, 4 Drawing Sheets

U.S. PATENT DOCUMENTS

| | | | |
|---|---|---|---|
| 3,725,743 | A | 4/1973 | Murayama |
| 4,275,410 | A | 6/1981 | Grinberg et al. |
| 4,371,744 | A | 2/1983 | Badet et al. |
| 5,081,563 | A | 1/1992 | Feng et al. |
| 5,200,579 | A | 4/1993 | Takeuchi |
| 5,258,648 | A | 11/1993 | Lin |
| 5,342,999 | A | 8/1994 | Frei et al. |
| 5,355,019 | A | 10/1994 | Fuchs |
| 5,375,042 | A | 12/1994 | Arima et al. |
| 5,389,743 | A | 2/1995 | Simila et al. |
| 5,528,080 | A | 6/1996 | Goldstein |
| 5,706,178 | A | 1/1998 | Barrow |
| 5,731,960 | A | 3/1998 | Fung |
| 5,753,976 | A | 5/1998 | Harvey |
| 5,875,102 | A | 2/1999 | Barrow |
| 5,883,436 | A | 3/1999 | Sadjadi et al. |
| 5,943,212 | A | 8/1999 | Horiuchi et al. |
| 6,010,769 | A | 1/2000 | Sasaoka et al. |
| 6,020,561 | A | 2/2000 | Ishida et al. |
| 6,040,524 | A | 3/2000 | Kobayashi et al. |
| 6,043,986 | A | 3/2000 | Kondo et al. |
| 6,046,901 | A | 4/2000 | Davis et al. |
| 6,111,204 | A | 8/2000 | Goenka |
| 6,130,200 | A | 10/2000 | Brodbeck et al. |
| 6,162,997 | A | 12/2000 | Memis |
| 6,215,372 | B1 | 4/2001 | Novak |
| 6,246,107 | B1 | 6/2001 | Silvestre |
| 6,271,481 | B1 | 8/2001 | Goenka et al. |
| 6,312,791 | B1 | 11/2001 | Fasano |
| 6,337,805 | B1 | 1/2002 | Forbes et al. |
| 6,414,248 | B1 | 7/2002 | Sundstrom |
| 7,088,002 | B2 | 8/2006 | Jensen |
| 7,375,432 | B2 * | 5/2008 | Jensen .................. 257/773 |
| 2006/0191712 | A1 | 8/2006 | Jensen |

FOREIGN PATENT DOCUMENTS

| | | |
|---|---|---|
| DE | 19642929 A1 | 7/1997 |
| DE | 19748689 | 5/1999 |
| DE | 19748689 A1 | 5/1999 |
| FR | 2468279 | 4/1981 |
| JP | 09-191184 | 7/1997 |
| JP | 2000-31329 | 1/2000 |
| WO | WO-02063934 A1 | 8/2002 |

OTHER PUBLICATIONS

"Amendment and Response mailed Jan. 18, 2002 in U.S. Appl. No. 09/740,103", 16 pgs.

"Amendment and Response mailed Oct. 21, 2002 in U.S. Appl. No. 09/740,103", 18 pgs.

"Amendment and Response mailed Sep. 25, 2003 in U.S. Appl. No. 09/740,103", 14 pgs.

"Appellant's Brief on Appeal mailed Nov. 19, 2004 in U.S. Appl. No. 09/740,103", 16 pgs.

"U.S. Appl. No. 11/382,450 Notice of Allowance mailed Apr. 30, 2007", 10 pgs.

"U.S. Appl. No. 11/382,450 Notice of Allowance mailed Aug. 30, 2007", NOAR,8 pgs.

"European Examination Report mailed Sep. 5,2006 in European Patent Application No. 01998012.7", 4 pgs.

"Final office action mailed Jun. 19, 2002 in U.S. Appl. No. 09/740,103", 19 pgs.

"Final office action mailed Dec. 31, 2003 in U.S. Appl. No. 09/740,103", 18 pgs.

"First Examination Report mailed Feb. 11, 2004 in Indian Patent Application No. 786/KOLNP/2003-K", 3 pgs.

"First Office Action mailed Jan. 15, 2007 in Japanese Patent Application No. 2002-563748", 4 pgs.

"First Office Action mailed Jan. 7, 2005 in Chinese Patent Application No. 01822713.9", 8 pgs.

"International Search Report mailed Jun. 20, 2002 in PCT Application No. PCT/US01/44651", 5 pgs.

"Non-final office action mailed Mar. 25, 2003 in U.S. Appl. No. 09/740,103", 20 pgs.

"Non-Final Office Action mailed Dec. 3, 2001 in U.S. Appl. No. 09/740,103", 9 pgs.

"Notice of allowance mailed Feb. 6, 2006 in U.S. Appl. No. 09/740,103", 9 pgs.

"Notice of allowance mailed Mar. 9, 2005 in U.S. Appl. No. 09/740,103", 9 pgs.

"PCT Written Opinion for corresponding PCT Application No. PCT/US01/44651", (Mar. 15, 2005), 7 pgs.

"Request for Continued Examination mailed Dec. 18, 2002 in U.S. Appl. No. 09/740,103", 1 pg.

"Request for Continued Examination mailed Jun. 9, 2005 in U.S. Appl. No. 09/740,103", 6 pgs.

"Response to 2nd Office Action mailed May 3, 2006 in Chinese Patent Application No. 01822713.9", 12 pgs.

"Response to European Examination Report mailed Jul. 2, 2007 in European Patent Application No. 01998012.7", 8 pgs.

"Response to First Office Action in Chinese Patent Application No. 01822713.9", 15 pgs.

"Response to Office Action mailed Aug. 18, 2005 in Korean Patent Application No. 10-2003-7008112", 22 pgs.

"Response to Substantive Examination Adverse Report mailed Nov. 23, 2005 in Malaysian Patent Application No. PI 20015492", 33 pgs.

"Second Office Action / Telephone Conversation on Apr. 21, 2006 in Chinese Patent Application No. 01822713.9", 1 pg.

"Substantive Examination Adverse Report mailed Aug. 24, 2005 in Malaysian Patent Application No. PI 20015492", 3 pgs.

"Supplemental Notice of Allowability mailed Jun. 15, 2005 in U.S. Appl. No. 09/740,103", 5 pgs.

"The Examiner's Grounds For Rejection mailed Jun. 21, 2005 in Korean Patent Application No. 10-2003-7008112", 6 pgs.

Anonymous, "Via Reinforced BGA Land", *Research Disclosure*, Disclosure No. 438037, Kenneth Mason Publications, Hampshire, Great Britain,(Oct. 2000), 1749-1750.

"Malaysian Application No. PI 20015492 Examiner's Report to the Registrar under Regulation 27C / 27D", (Nov. 20, 2007), 2 pgs.

* cited by examiner

METHOD OF FABRICATING A VIA ATTACHED TO A BOND PAD UTILIZING A TAPERED INTERCONNECT

RELATED APPLICATION(S)

This application is a divisional of U.S. application Ser. No. 11/382,450 filed May 9, 2006 now U.S. Pat. No. 7,375,432, which is a divisional of U.S. application Ser. No. 09/740,103 filed Dec. 18, 2000 now U.S. Pat. No. 7,088,002, which are incorporated herein by reference.

FIELD

The present invention is related to circuit substrates, and more particularly to interconnects used in circuit substrates.

BACKGROUND

Circuit substrates are the building blocks of modem electronic systems, such as computers, cellular telephones, and personal digital assistants. Circuit substrates provide a platform for mounting and interconnecting electronic components, such as integrated circuits, resistors, capacitors, and inductors that perform the electronic functions required in modem electronic systems. Interconnects are conductive structures that connect together the electronic components on a circuit substrate.

Interconnects can be simple structures or complex structures. Simple interconnect structures include conductive traces. Conductive traces are typically thin, narrow strips of conductive material, such as copper, that are formed on a surface of a circuit substrate and connect one electronic component to another. Complex interconnect structures include structures such as vias coupled to pads. Vias are typically cylindrically shaped conductive segments that connect together different layers or components on different layers of a circuit substrate. Pads are typically thin, square conductive structures formed on a surface layer of a circuit substrate. Pads provide sites for connecting components, such as integrated circuits or other electronic devices, to signals available on the circuit substrate. Signals include power or constant potential signals and information carrying signals.

One problem in modern electronic systems is that the systems generate a step demand for current and this step demand for current causes current surges in the conductors that make up an electronic system's power distribution system. These current surges can cause the conductors that make up the power distribution system to emit electromagnetic radiation (sometimes termed electromagnetic interference (EMI)). The amount of radiation that an electronic device is permitted to emit is usually controlled by government regulations. In the United States, the regulations are promulgated and enforced by the Federal Communications Commission. Therefore, the electromagnetic emissions from electronic devices must be controlled.

One solution to the problem of power distribution system electromagnetic emissions requires connecting decoupling capacitors between pads coupled to a constant potential source and pads coupled to a ground or zero potential source. The decoupling capacitors provide a local source of energy, which can quickly be supplied to circuits coupled to the substrate to meet a step increase in demand for current, without causing current surges in other parts of the power distribution system. Unfortunately, the vias that couple the constant potential source to the pads and decoupling capacitors exhibit a large inductance at high frequencies, so a step demand for current in an electronic device can generate voltage drops in the vias. If the step increases in demand for current occur relatively infrequently, then decoupling capacitors work well to reduce unwanted electromagnetic radiation or EMI in an electronic system. However, as the frequency of operation of modern electronic systems increases, the step increases in demand for current will increase in frequency, and this increase in frequency will cause the voltage drops in the vias to generate unwanted noise voltages at a higher rate. Unwanted noise voltages, when generated at this higher rate, create currents which flow in the power distribution system and generate significant amounts of electromagnetic radiation or EMI.

For these and other reasons there is a need for the present invention.

DESCRIPTION

Figure 1A:
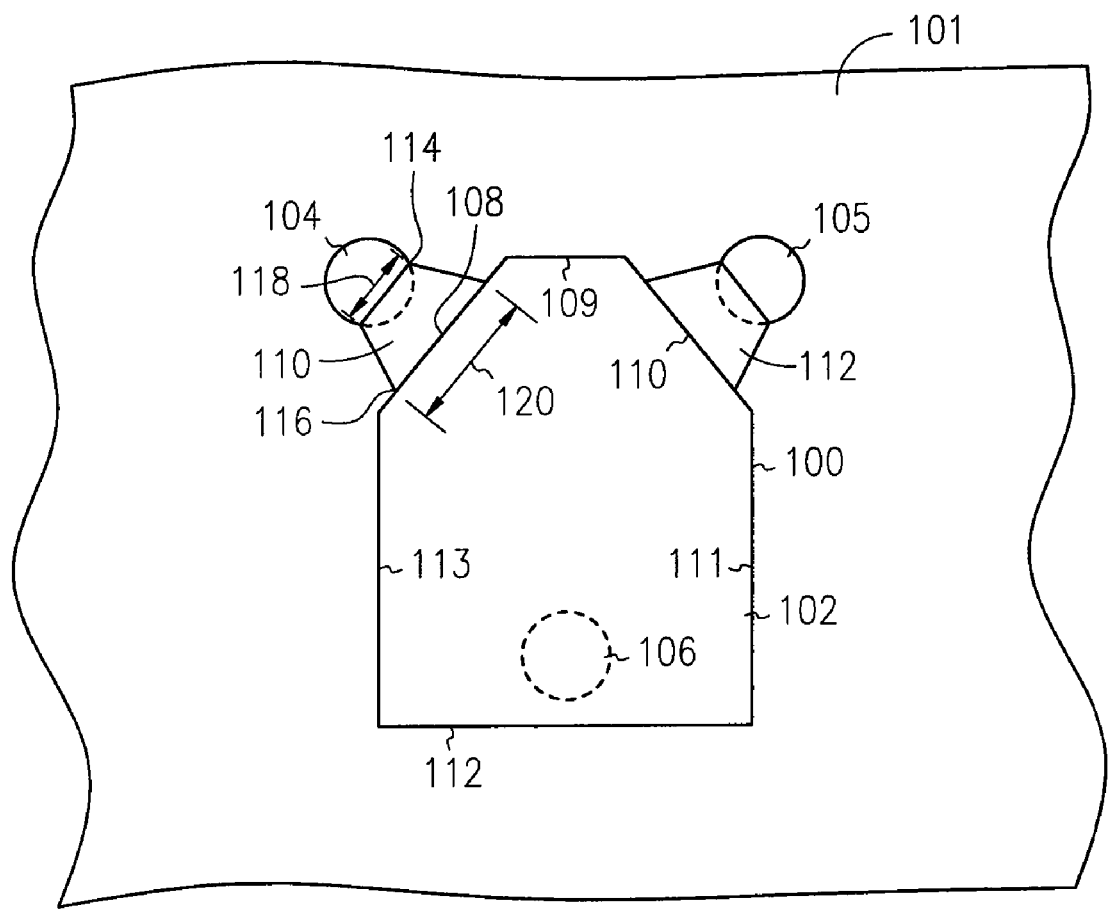
FIG. 1A is a top view of some embodiments of an interconnect according to the teachings of the present invention.

In the following detailed description of the invention, reference is made to the accompanying drawings which form a part hereof, and in which are shown, by way of illustration, specific embodiments of the invention which may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is not to be taken in a limiting sense, and the scope of the present invention is defined only by the appended claims, along with the full scope of equivalents to which such claims are entitled.

FIG. 1A is a top view of some embodiments of an interconnect 100 according to the teachings of the present invention. As can be seen in FIG. 1A, the interconnect 100 is formed on a substrate 101. The interconnect 100 includes a pad 102 and three vias 104-106 coupled to the pad 102. The via 104 is coupled to the pad 102 by a conductive segment 110. The via 105 is coupled to the pad 102 by a conductive segment 112. The via 106 is directly coupled to the pad 102. To directly couple the via 106 to the pad 102, after the via 106 is formed in the substrate 101, the pad 102 is formed substantially over the via 106 such that the via 106 is physically and electrically coupled to the pad 102.

The pad 102 is formed by patterning and etching a conductive material, such as copper, aluminum, gold, silver, or tungsten, on a surface of the substrate 101. Prior to patterning and etching, a thin layer of conductive material is formed on a surface of the substrate 101 by a process such as chemical vapor deposition or electroplating. The shape of the pad 102 is defined by the patterning and etching process, but the pad 102 is not limited to a particular shape. In one embodiment, the perimeter of the pad 102 includes six substantially straight edges 108-113 connected together to form a six-sided shape, as shown in FIG. 1A. The pad 102 provides a site on the substrate 101 for coupling a signal to electronic components, such as integrated circuits, resistors, capacitors, or inductors, mounted on or near the substrate 101.

The three vias 104-106 are cylindrical conductors formed in the substrate 101. Vias are typically formed by etching a hole in one or more layers of a substrate and depositing a conductive material in the hole. The three vias 104-106 are not limited to being cylindrical. Any shape which allows transmission of a signal in the substrate 101 is suitable for use in the fabrication of the interconnect 100. Other exemplary shapes suitable for use in the fabrication of the vias 104-106 include square, octagonal, triangular, and hexagonal. The pad 102 is also not limited to use in connection with only three vias. The preferred embodiment of the interconnect 100 includes three vias, but reduction in electromagnetic interference is obtained using two or more vias to couple the pad 102 to a signal source. Those skilled in the art will appreciate that four-via interconnects, five-via interconnects, and interconnects including more than five vias can be formed in accordance with the teachings of the present invention. Simulations have shown that two or more vias improve the high frequency performance of the interconnect 100 when compared with the high frequency performance of an interconnect comprising only one via coupled to a pad.

The conductive segment 110 couples the pad 102 to the via 104. The conductive segment 110 is formed from a conductive material, such as copper, aluminum, gold, silver, or tungsten, and is preferably tapered. The conductive segment 110 has a first end 114 and a second end 116. The first end 114 has a first width 118, and the second end 116 has a second width 120. The first end 114 is connected to the via 104, and the second end 116 is connected to the pad 102. In one embodiment, the first width 118 is less than the second width 120. By making the first width 118 less than the second width 120, a tapered conductive segment can be formed between the pad 102 and the via 104. For a step change in current, a tapered conductive segment generally emits less electromagnetic radiation than an untapered segment used in the same interconnect configuration. The taper is not limited to a linear taper. Other functions, such as hyperbolic functions and exponential functions, may be used to define the taper of the conductive segment 110. The conductive segment 112, which connects the via 105 to the pad 102, is also preferably a tapered conductive segment.

Figure 1B:
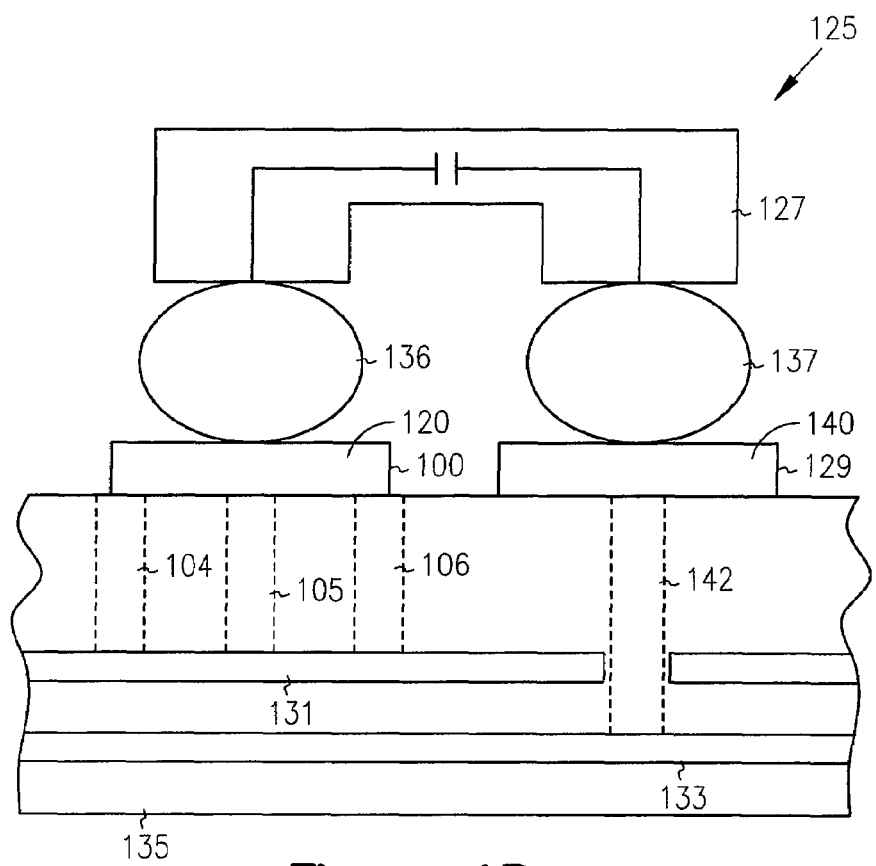
FIG. 1B is a side view of one embodiment of a circuit substrate including a capacitor coupled between a first interconnect and a second interconnect according to the teachings of the present invention.

FIG. 1B is a side view of one embodiment of a circuit substrate 125 including a capacitor 127 coupled between a first interconnect 100 and a second interconnect 129 according to the teachings of the present invention. The first interconnect 100 is coupled to a first potential plane 131 formed in the substrate 135, and the second interconnect 129 is coupled to a second potential plane 133 formed in the substrate 135. Each potential plane 131 and 133 is a conductive area or plate formed in the substrate 135 and provides a source of substantially constant potential during the operation of the electronic system formed on the substrate 135.

The solder element 136 electrically couples the capacitor 127 to the first interconnect 100, and the solder element 137 electrically couples the capacitor 127 to the second interconnect 129.

The first interconnect 100 is formed as described above in the description of FIG. 1A. However, it should be noted that it is preferable, as illustrated in FIG. 1A and FIG. 1B, to locate at least one of the three vias 104-106 substantially beneath the pad 102. By locating the via 106 substantially beneath the pad 102, surface area on the substrate 135 is made available for mounting electronic components. In addition, by locating the via 106 substantially beneath the pad 102, an extra conductive segment to couple the via 106 to the pad 102 is not required. Since an extra conductive segment can become a source of electromagnetic emissions during the operation of circuits coupled to the pad 102, a potential source of EMI is avoided.

The second interconnect 129 is preferably fabricated to be substantially identical to the first interconnect 100, however, the second interconnect 129 is not limited to being substantially identical to the first interconnect 100. The second interconnect 129 can include more vias than the first interconnect 100, or the second interconnect 129 can include fewer vias than the first interconnect 100. In the embodiment shown in FIG. 1B, the interconnect 129, includes a pad 140 coupled to a single via 142 coupled to the second potential plane 133. An insulating ring (not shown) typically separates the single via 142 from the first potential plane 131 at any location in the first potential plane 131 where the single via 142 passes through the first potential plane 131.

The capacitor 127 electrically couples the first potential plane 131 to the second potential plane 133. In one embodiment, the capacitor 127 is a high frequency capacitor capable of supplying current in response to a step demand in current on one of the potential planes 131 and 133. In another embodiment, the capacitor 127 is a ceramic capacitor. In yet another embodiment, the capacitor 127 is a high frequency ceramic capacitor. The present invention is not limited to a single capacitor coupling the first potential plane 131 to the second potential plane 133. Those skilled in the art will appreciate that for many substrates, a plurality of capacitors is used to decouple potential planes.

The substrate 135 provides a foundation for mounting and interconnecting electronic components that make up an electronic system. Exemplary materials suitable for use in the fabrication of the substrate 135 include ceramics, epoxies, silicon, and other insulators and semiconductors. Typically, a circuit substrate, such as the circuit substrate 125, includes a plurality of interconnects, such as interconnects 100 and 129, and a plurality of constant potential planes, such as the first potential plane 131 and the second potential plane 133.

Figure 1C:
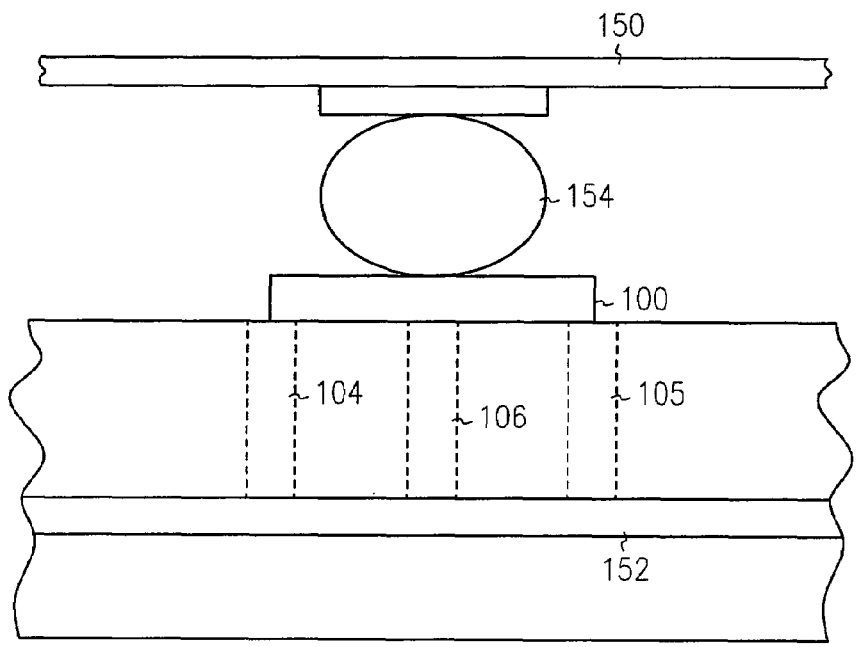
FIG. 1C is a side view of one embodiment of an interconnect coupled to an integrated circuit according to the teachings of the present invention.

FIG. 1C is a side view of one embodiment of the interconnect 100 coupled to an integrated circuit 150 according to the teachings of the present invention. As can be seen in FIG. 1C, a signal path is formed between the integrated circuit 150 and a constant potential plane 152. The path includes the solder element 154, the interconnect 100, and a constant potential plane 152. A signal at the constant potential plane 152 passes through the interconnect 100 and through the solder element 154 to the integrated circuit 150. The interconnect includes the vias 104-106 coupling the constant potential plane 152 to the solder element 154. Typically, the solder element 154 couples a pad on the integrated circuit 150 to the pad 102. The high frequency performance of the interconnect 100 provides faster coupling of signals between the constant potential plane 152 and the integrated circuit 150.

Figure 2A:
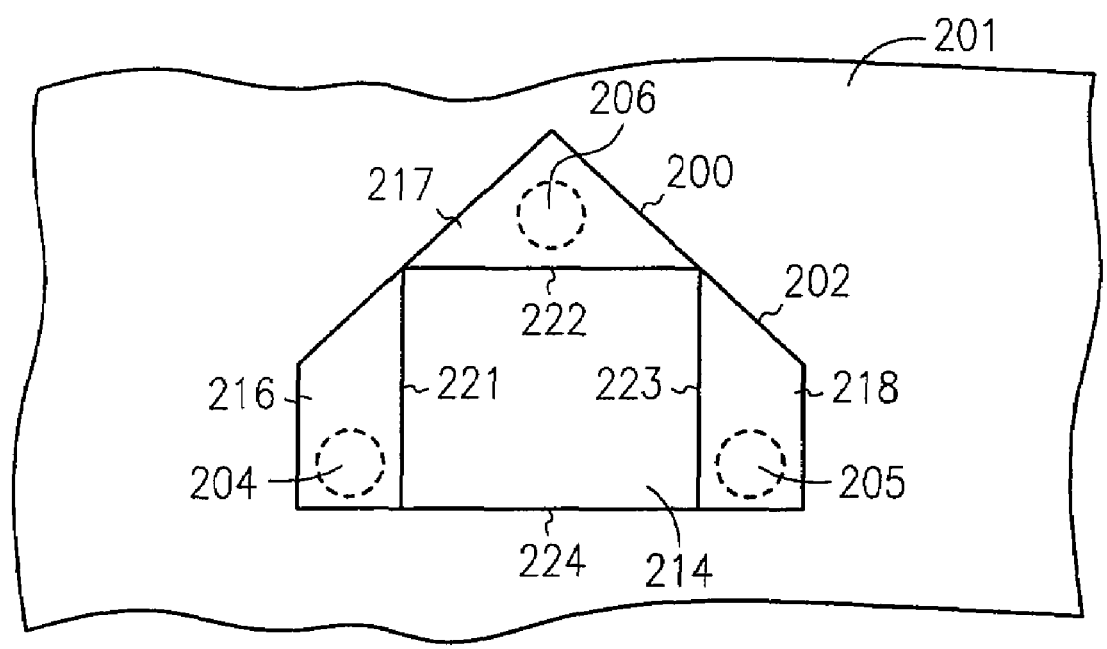
FIG. 2A is a top view another embodiment of an interconnect according to the teachings of the present invention.

FIG. 2A is a top view of some embodiments of an interconnect 200 according to the teachings of the present invention. As can be seen in FIG. 2A, the interconnect 200 is formed on the substrate 201. The interconnect 200 includes a pad 202 and three vias 204-206 formed on the substrate 201. The pad 202 is directly coupled to the three vias 204-206. To directly couple the pad 202 to the three vias 204-206, after the three vias 204-206 are formed, the pad 202 is formed substantially over the three vias 204-206 such that each of the three vias 204-206 is physically and electrically coupled to the pad 202.

Figure 2B:
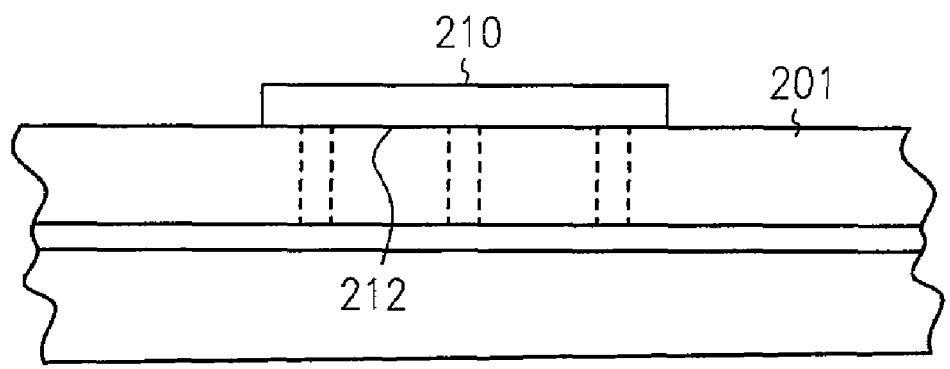
FIG. 2B is a side view of the interconnect shown in FIG. 2A.

The pad 202 is formed by patterning and etching a conductive material, such as copper, aluminum, gold, silver, or tungsten, on a surface of the substrate 201. Prior to patterning and etching, a thin layer of conductive material is formed on a surface of the substrate 201 by a process such as chemical vapor deposition or electroplating. FIG. 2B is a side view of the interconnect 200 shown in FIG. 2A. Referring to FIG. 2B, the pad 202 has a top surface 210 and a bottom surface 212, and the bottom surface 212 is in contact with the substrate 201. Referring again to FIG. 2A, the shape of the pad 202 is defined by the patterning and etching process, but the pad 202 is not limited to a particular shape. The pad 202 includes a substantially square core pad 214 and three non-square pads 216-218. The square core pad 214 has four edges 221-224, and each of the three non-square pads 216-218 is located adjacent to one of the four edges 221-224. In one embodiment, at least one of the three non-square pads 216-218 is a substantially triangular pad, such as the pad 217. The pad 202 provides a site on the substrate 201 for coupling a signal to electronic components, such as integrated circuits, resistors, capacitors, or inductors, mounted on or near the substrate 201.

The three vias 204-206 are cylindrical conductors formed in the substrate 201. Vias are typically formed by etching a hole in one or more layers of a substrate and depositing a conductive material in the hole. The three vias 204-206 are not limited to being cylindrical. Any shape that allows transmission of a signal in the substrate 201 is suitable for use in the fabrication of the interconnect 200. Other exemplary shapes suitable for use in the fabrication of the vias 204-206 include square, octagonal, triangular, and hexagonal. The pad 202 is not limited to use in connection with three vias. The preferred embodiment of the interconnect 200 includes three vias, but reduction in electromagnetic interference is obtained using two or more vias to couple the pad 202 to a signal source. Those skilled in the art will appreciate that four-via interconnects, five-via interconnects, and interconnects including more than five vias can be formed in accordance with the teachings of the present invention. Simulations have shown that two or more vias improve the high frequency performance of the interconnect 200 when compared with the high frequency performance of an interconnect comprising only one via coupled to a pad.

Figure 2C:
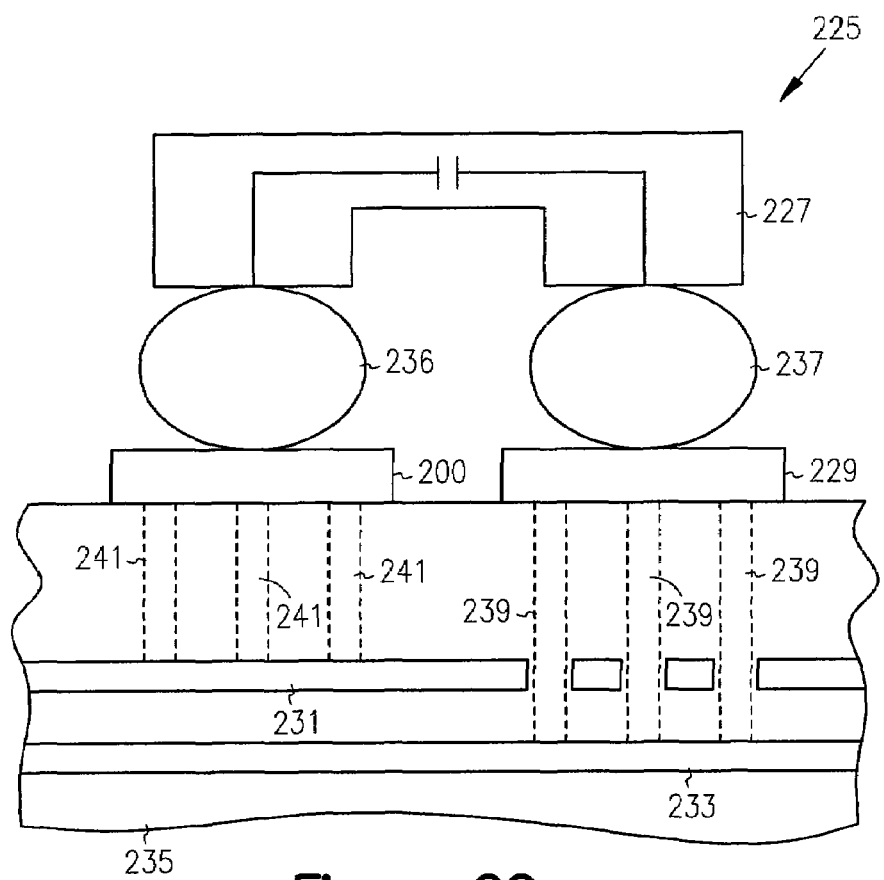
FIG. 2C is a side view of another embodiment of a capacitor coupled between a first interconnect and a second interconnect according to the teachings of the present invention.

FIG. 2C is a side view of one embodiment of a circuit substrate 225 including a capacitor 227 coupled between a first interconnect 200 and a second interconnect 229 according to the teachings of the present invention. The first interconnect 200 is coupled to a first potential plane 231 formed in a substrate 235, and the second interconnect 229 is coupled to a second potential plane 233 formed in the substrate 235. Each potential plane 231 and 233 is a conductive area or plate formed in the substrate 235 and provides a source of substantially constant potential during the operation of the electronic system formed on the substrate 235. The solder element 236 electrically couples the capacitor 227 to the first interconnect 200, and the solder element 237 electrically couples the capacitor 227 to the second interconnect 229.

The first interconnect 200 is formed as described above in the description of FIG. 2A. However, it should be noted that it is preferable, as shown in FIG. 2B and FIG. 2A, to locate the three vias 204-206 substantially beneath the pad 202.

By locating the three vias 204-206 substantially beneath the pad 202, surface area on the substrate 225 is made available for mounting electronic components. In addition, extra conductive segments that can become sources of electromagnetic emissions during the operation of circuits coupled to the pad 202 are not added to the power distribution system.

The second interconnect 229 is preferably substantially identical to the first interconnect 200, except for the lengths of the vias. One or more vias 239 are typically coupled to the second potential plane 233 rather than the first potential plane 231, so the one or more vias 239 will be slightly longer or shorter than the one or more vias 241 of the first interconnect 200. However, the second interconnect 229 is not limited to being substantially identical to the first interconnect 2000. The second interconnect 229 may include more vias than the first interconnect 200 or fewer vias that the first interconnect 200. However, the second interconnect 229 is illustrated in FIG. 2C as substantially identical to the first interconnect 200. If the one or more vias 239 pass through the first potential plane 131, then a separate insulating ring (not shown) typically separates each of the one or more vias 239 from the first potential plane 131.

The capacitor 227 electrically couples the first potential plane 231 to the second potential plane 233. In one embodiment, the capacitor 227 is a high frequency capacitor capable of supplying current in response to a step demand in current on one of the potential planes 231 and 233. In another embodiment, the capacitor 227 is a ceramic capacitor. In yet another embodiment, the capacitor 227 is a high frequency ceramic capacitor. The present invention is not limited to a single capacitor coupling the first potential plane 231 to the second potential plane 233. Those skilled in the art will appreciate that for many substrates, a plurality of capacitors is used to decouple potential planes.

The circuit substrate 225 includes the substrate 235 which provides a foundation for mounting and interconnecting electronic components that make up an electronic system. Exemplary materials suitable for use in the fabrication of the substrate 235 include ceramics, epoxies, silicon, and other insulators and semiconductors. Typically, a circuit substrate, such as the circuit substrate 225, includes a plurality of interconnects, such as interconnects 200 and 229, and a plurality of constant potential planes, such as the first potential plane 231 and the second potential plane 233.

Figure 2D:
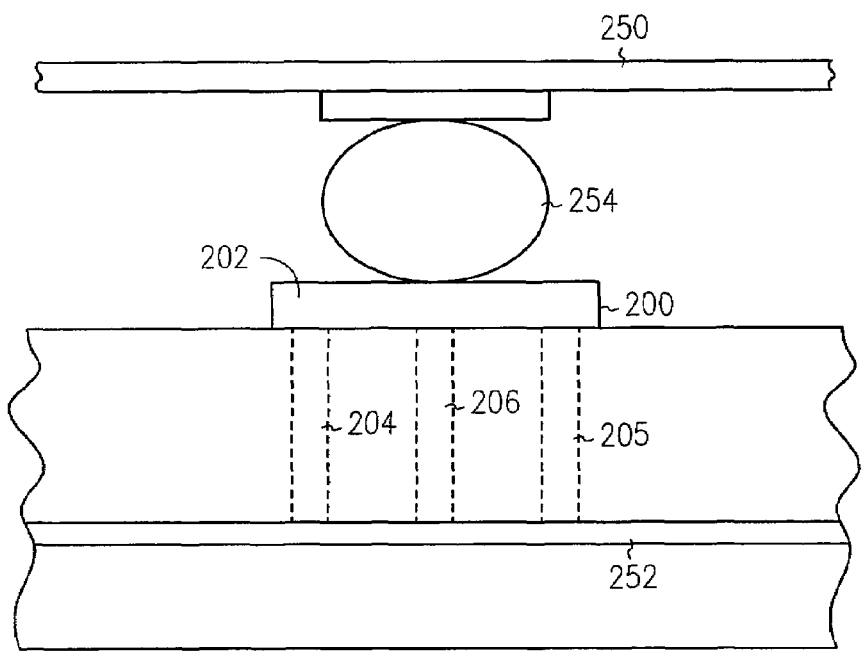
FIG. 2D is a side view of another embodiment of an interconnect coupled to an integrated circuit according to the teachings of the present invention.

FIG. 2D is a side view of one embodiment of the interconnect 200 coupled to an integrated circuit 250 according to the teachings of the present invention. As can be seen in FIG. 2C, a signal path is formed between the integrated circuit 250 and a constant potential plane 252. The path includes the solder element 254, the interconnect 200, and a constant potential plane 252. A signal at the constant potential plane 252 passes through the interconnect 200 and through the solder element 254 to the integrated circuit 250. The interconnect includes the vias 204-206 coupling the constant potential plane 252 to the solder element 254. Typically, the solder element 254 couples a pad on the integrated circuit 250 to the pad 202. The high frequency performance of the interconnect 200 provides faster coupling of signals between the constant potential plane 252 and the integrated circuit 250.

Although specific embodiments have been described and illustrated herein, it will be appreciated by those skilled in the art, having the benefit of the present disclosure, that any arrangement which is intended to achieve the same purpose may be substituted for a specific embodiment shown. This application is intended to cover any adaptations or variations of the present invention. Therefore, it is intended that this invention be limited only by the claims and the equivalents thereof.

What is claimed is:

1. A method of forming an interconnect, the method comprising:
   forming at least two vias in a substrate;
   forming a conductive pad on a surface of the substrate;
   forming at least one tapered conductive segment on the surface of the substrate and coupled to the conductive pad,
   wherein only a first via of the at least two vias is formed substantially beneath the conductive pad and is directly coupled to the conductive pad, and wherein a second via of the at least two vias is coupled to the conductive pad by a first one of the at least one tapered conductive segments, the first one of the tapered conductive segments having a first end having a first width and a second end having a second width, the first end being connected to the second via and the second end being connected to the conductive pad, the first width being less than the second width.

2. The method of claim 1, further including:
   forming a second one of the at least one tapered conductive segments on the surface of the substrate and coupled to the conductive pad,
   wherein a third via of the at least two vias coupled to the conductive pad is coupled to the conductive pad by a second one of the at least one tapered conductive segments, the second one of the tapered conductive segments having a third end having a third width and a fourth end having a fourth width, the third end being connected to the third via the fourth end being connected to the conductive pad, the third width being less than the fourth width.

3. The method of claim 1, wherein forming the conductive pad includes forming a layer of conductive material on the surface of the substrate.

4. The method of claim 3, wherein forming the conductive pad further includes patterning and etching the conductive material on the surface of the substrate.

5. The method of claim 1, wherein the conductive pad includes copper.

6. The method of claim 1, wherein the conductive pad includes gold.

7. The method of claim 1, further including:
   electrically coupling an integrated circuit to the conductive pad.

8. The method of claim 7, wherein electrically coupling an integrated circuit to the pad comprises:
   coupling the integrated circuit to the conductive pad through a solder element.

9. The method of claim 1, wherein forming the conductive pad includes forming the conductive pad to have at least six substantially straight edges connected together to form a six-sided shape.

10. The method of claim 9, wherein forming at least one tapered conductive segment on the surface of the substrate includes:
    forming two tapered conductive segments, wherein each of the two tapered conductive segments directly contacts the conductive pad along one of the at least six substantially straight edges, and wherein any one of the at least six substantially straight edges is directly in contact with no more than one of the two tapered conductive segments.

11. The method of claim 1, wherein the at least two vias coupled to the conductive pad comprise cylindrical conductors.

12. The method of claim 1, further comprising:
    forming a second interconnect on the surface of the substrate;
    coupling the conductive pad to the second interconnect through a capacitor;
    coupling the conductive pad through the at least to least two vias to a first potential plane formed in the substrate; and
    coupling the second interconnect to a second potential plane formed in the substrate.

13. A method comprising:
    forming an interconnect on a surface of a substrate, the substrate including at least one constant potential plane formed within the substrate and below the surface of the substrate; and
    forming a signal path between an integrated circuit and the constant potential plane through the interconnect,
    wherein forming the interconnect includes,
        forming at least two vias in the substrate coupled to the constant potential plane;
        forming a conductive pad on the surface of the substrate;
        forming at least one tapered conductive segment on the surface of the substrate and coupled to the conductive pad,
        wherein only a first via of the at least two vias is formed substantially beneath the conductive pad and is directly coupled to the conductive pad, and wherein a second via of the at least two vias is coupled to the conductive pad by a first one of the at least one tapered conductive segments, the first one of the tapered conductive segments having a first end having a first width and a second end having a second width, the first end being connected to the second via and the second end being connected to the conductive pad, the first width being less than the second width.

14. The method of claim 13, wherein forming the signal path includes forming the signal path though a solder element electrically coupling the integrated circuit and the conductive pad of the interconnect.

15. The method of claim 13, further including:
    forming a second one of the at least one tapered conductive segments on the surface of the substrate and coupled to the conductive pad,
    wherein a third via of the at least two vias coupled to the conductive pad is coupled to the conductive pad by the second one of the at least one tapered conductive segments, the second one of the tapered conductive segments having a third end having a third width and a fourth end having a fourth width, the third end being connected to the third via the fourth end being connected to the conductive pad, the third width being less than the fourth width.

16. The method of claim 13, wherein forming the interconnect includes:
    depositing a layer of gold on the surface of the substrate; and
    patterning and etching the layer of gold.

* * * * *